(12) United States Patent
Wu

(10) Patent No.: US 12,305,050 B2
(45) Date of Patent: May 20, 2025

(54) QUANTUM DOT INK AND DISPLAY TERMINAL

(71) Applicant: Shenzhen China Star Optoelectronics Semiconductor Display Technology Co., Ltd., Guangdong (CN)

(72) Inventor: Yongwei Wu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 38 days.

(21) Appl. No.: 17/047,706

(22) PCT Filed: Sep. 1, 2020

(86) PCT No.: PCT/CN2020/112771
§ 371 (c)(1),
(2) Date: Oct. 15, 2020

(87) PCT Pub. No.: WO2021/248708
PCT Pub. Date: Dec. 16, 2021

(65) Prior Publication Data
US 2023/0125791 A1    Apr. 27, 2023

(30) Foreign Application Priority Data

Jun. 12, 2020 (CN) .......................... 202010533283.1

(51) Int. Cl.
C09D 11/38 (2014.01)
C09D 11/02 (2014.01)
H10K 85/40 (2023.01)

(52) U.S. Cl.
CPC .............. *C09D 11/38* (2013.01); *C09D 11/02* (2013.01); *H10K 85/40* (2023.02); *C09K 2323/031* (2020.08)

(58) Field of Classification Search
CPC ........ C09D 11/38; C09D 11/02; H10K 85/40; H10K 59/38; H10K 2102/331
See application file for complete search history.

(56) References Cited

U.S. PATENT DOCUMENTS

| 2010/0076147 A1 | 3/2010 | Hoorne-Van Gemert et al. |
| 2020/0040184 A1 | 2/2020 | El-Said |

FOREIGN PATENT DOCUMENTS

| CN | 110867465 | 3/2020 |
| CN | 111454606 | 7/2020 |

(Continued)

OTHER PUBLICATIONS

International Search Report and the Written Opinion Dated Mar. 11, 2021 From the International Searching Authority Re. Application No. PCT/CN2020/112771 and Its Translation Into English. (21 Pages).

(Continued)

*Primary Examiner* — Sophie Hon (57) ABSTRACT

The present application provides a quantum dot ink and a display terminal. Components of the quantum dot ink include a low-molecular-weight silicon polymer which includes three organosilicon group directly connected to a nitrogen atom and each independently containing a silicon-oxygen bond as a skeleton and containing an amide or ester branched chain, such that the interaction of multiple hydrogen bonds in the low-molecular-weight silicon polymer is used to enhance the adhesion of the quantum dot ink after curing into a film, and meanwhile, the film is provided with self-repair properties.

15 Claims, 2 Drawing Sheets

(56) References Cited

FOREIGN PATENT DOCUMENTS

CN            111621199 B  *  4/2021  ............. C09D 11/30
JP            2015217359 A  *  12/2015

OTHER PUBLICATIONS

Lei et al. "Morphology Controlling of Quantum Dots Thin Films Prepared by Inkjet Printing", Acta Photonica Sinica, 48(6): 0616001-1-0616001-9, Jun. 30, 2019 & English Translation.

Liu et al. "Supramolecular Silicone Coating Capable of Strong Substrate Bonding, Readily Damage Healing, and Easy Oil Sliding", Science Advances, 5(11): caaw5643-1-caaw5643-8, Nov. 1, 2019.

* cited by examiner

QUANTUM DOT INK AND DISPLAY TERMINAL

RELATED APPLICATIONS

This application is a National Phase of PCT Patent Application No. PCT/CN2020/112771 having International filing date of Sep. 1, 2020, which claims the benefit of priority of Chinese Patent Application No. 202010533283.1 filed on Jun. 12, 2020. The contents of the above applications are all incorporated by reference as if fully set forth herein in their entirety.

FIELD AND BACKGROUND OF THE INVENTION

The present invention relates to a field of display technology, in particular to a quantum dot ink and a display terminal.

Inkjet-printing (IJP) technology can control ink drop positions with high precision for ink deposition in a pixel area to obtain a fine pattern, so it is suitable for manufacturing of a panel of large-size and high-resolution. Quantum dot materials have great potential in the display field by virtue of their excellent luminescence properties. In particular, the quantum dot materials are adapted to a wet processing technology, so the quantum dot inkjet-printing technology is considered to be a future-oriented method of manufacturing a device of low-cost and high-efficiency.

Quantum dot inkjet-printing technology has certain requirements for the ink system. In the prior art, quantum dot inks are mostly composed of a mixture of quantum dot light-emitting materials and resin polymers. The resin materials are used to adjust adhesion and surface tension of the ink, and becomes a continuous base material after film formation. At present, resin materials such as acrylates have poor adhesion to a substrate after being cured into a film, and the film is relatively brittle, whose mechanical properties need to be improved. In addition, the film formed by curing the resin material does not have self-repair properties, and is likely to cause irreversible damage when it is subjected to inevitable external damage such as scratching.

In summary, the existing quantum dot ink materials have the problem of poor adhesion to the substrate after being cured into a film, insufficient mechanical properties, and no self-repair performance. Therefore, there is a need to provide a quantum dot ink and a display terminal to improve this defect.

SUMMARY OF THE INVENTION

The embodiments of the present application provide a quantum dot ink and a display terminal to solve the problems of poor adhesion to the substrate, insufficient mechanical performance, and no self-repair performance of existing quantum dot ink materials after curing and forming a film.

An embodiment of the present application provides quantum dot ink, composed of components including a quantum dot material, a functional aid, and a low-molecular-weight silicon polymer, wherein the low-molecular-weight silicon polymer has a general structural formula as follows:

wherein A1, A2, and A3 have same or different structures, and each independently represents an organosilicon group with a silicon-oxygen bond as a skeleton and containing an amide or ester branched chain.

According to an embodiment of the present application, A1, A2 and A3 in the low-molecular-weight silicon polymer have a same structure with a general structural formula as follows:

or wherein R1 is O or N, R2 is $-(CH_2)_m-CH_3$, and R3 is O or NH.

According to an embodiment of the present application, m is an integer from 0 to 12, n1 is an integer from 1 to 3, n2 is an integer from 1 to 3, n3 is an integer from 1 to 100, n4 is an integer from 1 to 5, and n5 is an integer from 1 to 6.

According to an embodiment of the present application, the low-molecular-weight silicon polymer has a molecular weight ranging between 500 and 8000 g/mol.

According to an embodiment of the present application, the low-molecular-weight silicon polymer is present in an amount of 10 wt % to 30 wt %.

According to an embodiment of the present application, the quantum dot material is present in an amount of 10 wt % to 50 wt %.

According to an embodiment of the present application, the functional aid is present in an amount of 0.1 wt % to 3 wt %.

According to an embodiment of the present application, the quantum dot material includes a group II-IV compound, a group III-V compound, a group IV-VI compound, a group I-III-VI compound, or combinations thereof.

According to an embodiment of the present application, the functional aid includes a surface tension regulator and a leveling agent.

Another embodiment of the present application provides a display terminal, including a display panel and a terminal body,
wherein the display panel is arranged on the terminal body, the display panel includes a light-emitting layer or a color conversion layer, and a material of the light-emitting layer or the color conversion layer includes a quantum dot ink composed of components including a quantum dot material, a functional aid, and a low-molecular-weight silicon polymer; and
wherein the low-molecular-weight silicon polymer has a general structural formula as follows:

wherein A1, A2, and A3 have same or different structures, and each independently represents an organosilicon group with a silicon-oxygen bond as a skeleton and containing an amide or ester branched chain.

According to an embodiment of the present application, A1, A2 and A3 in the low-molecular-weight silicon polymer have a same structure with a general structural formula as follows:

wherein R1 is O or N, R2 is —$(CH_2)_m$—$CH_3$, and R3 is O or NH.

According to an embodiment of the present application, m is an integer from 0 to 12, n1 is an integer from 1 to 3, n2 is an integer from 1 to 3, n3 is an integer from 1 to 100, n4 is an integer from 1 to 5, and n5 is an integer from 1 to 6.

According to an embodiment of the present application, the low-molecular-weight silicon polymer has a molecular weight ranging between 500 and 8000 g/mol.

According to an embodiment of the present application, the low-molecular-weight silicon polymer is present in an amount of 10 wt % to 30 wt %.

According to an embodiment of the present application, the quantum dot material is present in an amount of 10 wt % to 50 wt %.

According to an embodiment of the present application, the functional aid is present in an amount of 0.1 wt % to 3 wt %.

According to an embodiment of the present application, the quantum dot material includes a group II-IV compound, a group III-V compound, a group IV-VI compound, a group I-III-VI compound, or combinations thereof.

According to an embodiment of the present application, the functional aid includes a surface tension regulator and a leveling agent.

Another embodiment of the present application provides a display terminal, including a display panel and a terminal body,
wherein the display panel is arranged on the terminal body, the display panel includes a light-emitting layer or a color conversion layer, and a material of the light-emitting layer or the color conversion layer includes a quantum dot ink composed of components including a quantum dot material, a functional aid, and a low-molecular-weight silicon polymer; and
wherein the low-molecular-weight silicon polymer has a general structural formula as follows:

wherein A1, A2, and A3 have a same structure with a general structural formula as follows:

wherein R1 is N, R2 is —(CH$_2$)$_m$—CH$_3$, and R3 is NH.

According to an embodiment of the present application, m is an integer from 0 to 12, n1 is an integer from 1 to 3, n2 is an integer from 1 to 3, n3 is an integer from 1 to 100, n4 is an integer from 1 to 5, and n5 is an integer from 1 to 6.

Beneficial effects of embodiments of the present application: in the embodiments of the present application, by adding a low-molecular-weight silicon polymer to a quantum dot ink to utilize interaction of multiple hydrogen bonds in the low-molecular-weight silicon polymer to increase an intermolecular force of the polymer, adhesion and mechanical properties of the quantum dot ink after curing into a film are enhanced, meanwhile, making the film formed by curing the quantum dot ink have self-repair properties, which can reduce the influence of inevitable external damage such as scratching on the film formed by curing the quantum dot ink.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

The present application will be further explained below in conjunction with the drawings and specific embodiments:

An embodiment of the present application provides a quantum dot ink, composed of components including a quantum dot material, a functional aid, and a low-molecular-weight silicon polymer, wherein the low-molecular-weight silicon polymer has a general structural formula as follows:

wherein A1, A2, and A3 have same or different structures, and each independently represents an organosilicon group with a silicon-oxygen bond as a skeleton and containing an amide or ester branched chain.

Optionally, structures of the three organosilicon groups A1, A2, and A3 connected to a nitrogen atom in the low-molecular-weight silicon polymer are the same or different from each other.

Figure 1:
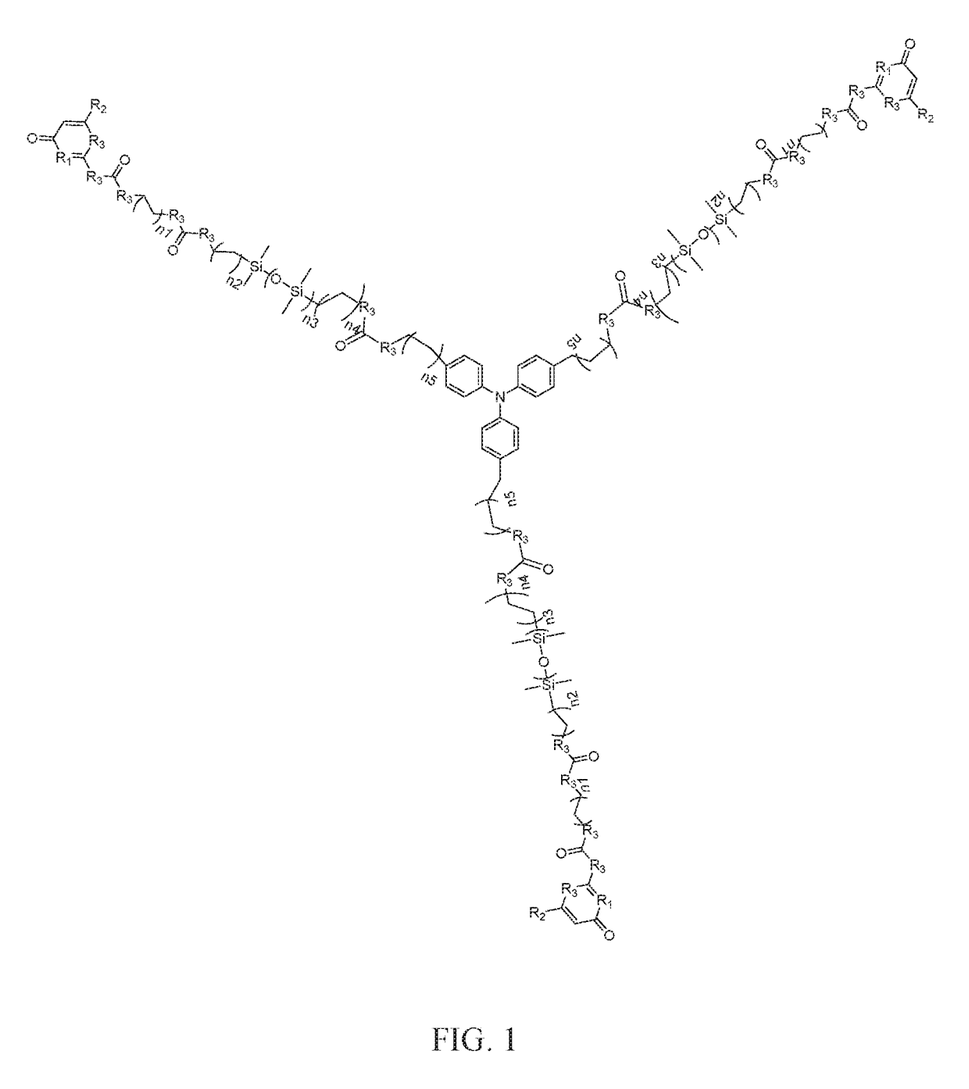
FIG. 1 is the general structural formula of the low-molecular-weight silicon polymer in an example of the present application.

In an embodiment of the present application, the three organosilicon groups A1, A2, and A3 connected to the nitrogen atom in the low-molecular-weight silicon polymer have the same structure as each other with a general structural formula as follows:

Specifically, as shown in FIG. 1, FIG. 1 is the general structural formula of the low-molecular-weight silicon polymer in an example of the present application, wherein R1 is O or N, R2 is —(CH$_2$)$_m$—CH$_3$, R3 is O or NH, and the NH connected to the carbon oxygen double bond and an organic group on an opposite side constitute an amide group. The low-molecular-weight silicon polymer in the quantum dot ink uses the silicon-oxygen bond as the skeleton. The longer the silicon-oxygen bond and the larger the bond angle, the more flexible the chain, so that the quantum dot ink after film formation has a small surface tension and good mechanical properties. In addition, the interaction of multiple hydrogen bonds in the low-molecular-weight silicon polymer can not only enhance the adhesion of the quantum dot ink to the substrate after being cured into a film, but also can give the film self-repair performance after being cured into a film, such that when occurring external damage, scratches or gaps caused by the external damage such as scratching can be automatically repaired, so as to reduce the influence of inevitable external damage such as scratching on the film formed after the quantum dot ink is cured into a film.

Of course, in some embodiments, in the general structural formulas of A1, A2, and A3, R1 can also be O, R3 is O, the O connected to the carbon oxygen double bond and an organic group on an opposite side constitute an ester group, and such a resulting composition of the quantum dot ink can also achieve the same technical effect as the above general structural formula after film formation, which will not be repeated herein for brevity.

Specifically, in the embodiments of the present application, the low-molecular-weight silicon polymer has a molecular weight ranging between 500 and 8000 g/mol, and the molecular weight of the low-molecular-weight silicon polymer is mainly controlled by a size of the molecular skeleton formed by silicon-oxygen bonds.

Optionally, in the general structural formulas of A1, A2 and A3, m is an integer from 0 to 12, n1 is an integer from 1 to 3, n2 is an integer from 1 to 3, n3 is an integer from 1 to 100, n4 is an integer from 1 to 5, and n5 is an integer from 1 to 6. For example, in the general structural formulae of A1, A2 and A3, m can be 0, 4, 6, 8, or 12, etc., n1 can be 1, 2 or 3, n2 can be 1, 2 or 3, n3 can be 1. 20, 40, 60, 80 or 100, etc., n4 can be 1, 3 or 5, etc., n5 can be 1, 2, 4, or 6, etc. Specific values can be selected according to actual needs, and are not particularly limited herein.

In the embodiments of the present application, the low-molecular-weight silicon polymer is present in an amount of 10 wt % to 30 wt %; the quantum dot material is present in an amount of 10 wt % to 50 wt %; and the functional aid is present in an amount of 0.1 wt % to 3 wt %. For example, the low-molecular-weight silicon polymer may be present in an amount of 10 wt %, 15 wt %, 20 wt %, 25 wt %, or 30 wt %, etc.; the quantum dot material may be present in an amount of 10 wt %, 20 wt %, 30 wt %, 40 wt %, or 50 wt %, etc.; and the functional aid may be present in an amount of 0.1 wt %, 0.5 wt %, 1 wt %, 2 wt %, or 3 wt %.

In the embodiments of the present application, the quantum dot material is a group II-IV compound. By selecting different materials from the group II-IV compounds, quantum dot materials with different colors such as red, blue, and green can be obtained. In some embodiments, the quantum dot material may also be a commonly used quantum dot material in the prior art such as a group III-V compound, a group IV-VI compound, or a group I-III-VI compound, which is not particularly limited herein.

In an embodiment of the present application, the functional aid includes a surface tension regulator and a leveling agent. In some embodiments, the functional aid may also include any one or a combination of two or more of a tension regulator, a dispersing agent, a wetting agent, and a leveling agent, which is not particularly limited herein.

The embodiments of the present application also provide a quantum dot ink, composed of components including a quantum dot material, a functional aid, and a low-molecular-weight silicon polymer, wherein the low-molecular-weight silicon polymer has a general structural formula as follows:

wherein A1, A2, and A3 have same or different structures, and each independently represents an organosilicon group with a silicon-oxygen bond as a skeleton and containing an amide or ester branched chain.

In an embodiment of the present application, the general structural formula of the organosilicon group connected to the nitrogen atom in the low-molecular-weight silicon polymer includes:

Among them, each of A1, A2 and A3 is any one of the aforementioned organosilicon groups, and A1, A2, and A3 are different from each other. Of course, in some embodiments, A1, A2, and A3 can also be the same, and they are all the above-mentioned organosilicon groups except for the first organosilicon group, or any two of A1, A2, and A3 have the same structure, and the remaining one of A1, A2, and A3 has a different structure. All of the above cases can obtain the same characteristics as the quantum dot ink provided in the above-mentioned embodiment. In actual production, A1, A2, and A3 can be selected and synthesized according to requirements, which are not particularly limited herein.

Specifically, in the embodiments of the present application, R1 may also be O, R3 is O, and the O connected to the carbon-oxygen double bond and the organic group on an opposite side constitute an ester group. The low-molecular-weight silicon polymer in the quantum dot ink uses the silicon-oxygen bond as the skeleton. The longer the silicon-oxygen bond and the larger the bond angle, the more flexible the chain, so that the quantum dot ink after film formation has a small surface tension and good mechanical properties. In addition, the interaction of multiple hydrogen bonds in the low-molecular-weight silicon polymer can not only enhance the adhesion of the quantum dot ink to the substrate after being cured into a film, but also can give the film self-repair performance after being cured into a film, such that when occurring external damage, scratches or gaps caused by the external damage such as scratching can be automatically repaired, so as to reduce the influence of inevitable external damage such as scratching on the film formed after the quantum dot ink is cured into a film.

Of course, in some embodiments, in the general structural formulas of A1, A2 and A3, R1 is N, R2 is —$(CH_2)_m$—$CH_3$, R3 is NH, the NH connected to the carbon oxygen double bond and an organic group on an opposite side constitute an amide group, and such a resulting composition of the quantum dot ink can also achieve the same technical effect as the above general structural formula after film formation, which will not be repeated herein for brevity.

Specifically, in the embodiments of the present application, the low-molecular-weight silicon polymer has a molecular weight ranging between 500 and 8000 g/mol, and the molecular weight of the low-molecular-weight silicon polymer is mainly controlled by a size of the molecular skeleton formed by silicon-oxygen bonds.

Optionally, in the general structural formulas of A1, A2 and A3, m is an integer from 0 to 12, n1 is an integer from 1 to 3, n2 is an integer from 1 to 3, n3 is an integer from 1 to 100, n4 is an integer from 1 to 5, and n5 is an integer from 1 to 6. Specific values can be selected according to actual needs, and are not particularly limited herein.

In the embodiments of the present application, the low-molecular-weight silicon polymer is present in an amount of 10 wt % to 30 wt %; the quantum dot material is present in an amount of 10 wt % to 50 wt %; and the functional aid is present in an amount of 0.1 wt % to 3 wt %.

In the embodiments of the present application, the quantum dot material is a group II-IV compound. By selecting different materials from the group II-IV compounds, quantum dot materials with different colors such as red, blue, and green can be obtained. In some embodiments, the quantum dot material may also be a commonly used quantum dot material in the prior art such as a group III-V compound, a group IV-VI compound, or a group I-III-VI compound, which is not particularly limited herein.

In an embodiment of the present application, the functional aid includes a surface tension regulator and a leveling agent. In some embodiments, the functional aid may also include any one or a combination of two or more of a tension regulator, a dispersing agent, a wetting agent, and a leveling agent, which is not particularly limited herein.

Beneficial effects of embodiments of the present application: in the embodiments of the present application, by adding a low-molecular-weight silicon polymer to a quantum dot ink to utilize interaction of multiple hydrogen bonds in the low-molecular-weight silicon polymer to increase an intermolecular force of the polymer, adhesion and mechanical properties of the quantum dot ink after curing into a film are enhanced, meanwhile, making the film formed by curing the quantum dot ink have self-repair properties, which can reduce the influence of inevitable external damage such as scratching on the film formed by curing the quantum dot ink.

Figure 2:
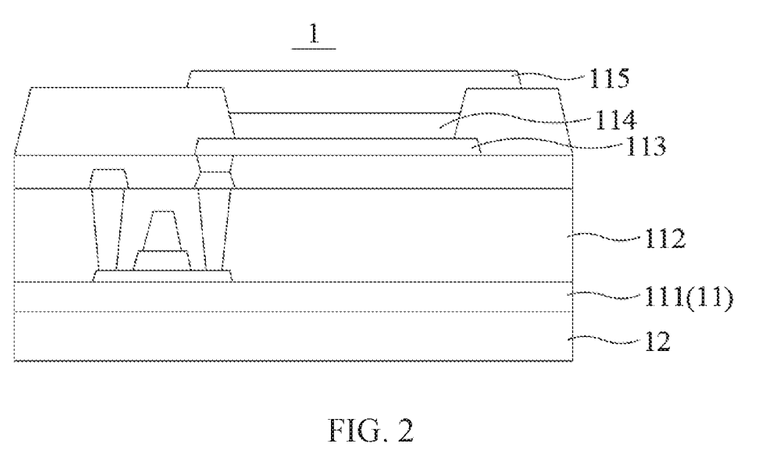
FIG. 2 is a schematic structural diagram of a display terminal provided by an embodiment of the present application.

The embodiment of the present application also provides a display terminal 1, as shown in FIG. 2. FIG. 2 is a schematic structural diagram of the display terminal 1 provided by an embodiment of the present application. The display terminal includes a display panel 11 and a terminal body 12. The display panel 11 is arranged on the terminal body 12.

In an embodiment of the present application, the display panel 11 is a quantum dot light-emitting diode display panel. The display panel 11 includes a substrate 111, a thin film transistor array layer 112, an anode 113, a light-emitting layer 114, and a cathode 115 stacked on the substrate. The material of the light-emitting layer 114 includes the quantum dot ink provided in the foregoing embodiment. By substituting the quantum dot ink or light-emitting layer material in the prior art with the quantum dot ink provided by the above-mentioned embodiments, the mechanical properties of the light-emitting layer 114 containing the quantum dot ink and the adhesion between adjacent films can be improved. In addition, the light-emitting layer 114 can also be provide with good self-repair performance which reduces the damage to the light-emitting layer 114 caused by inevitable external damage such as scratching.

Figure 3:
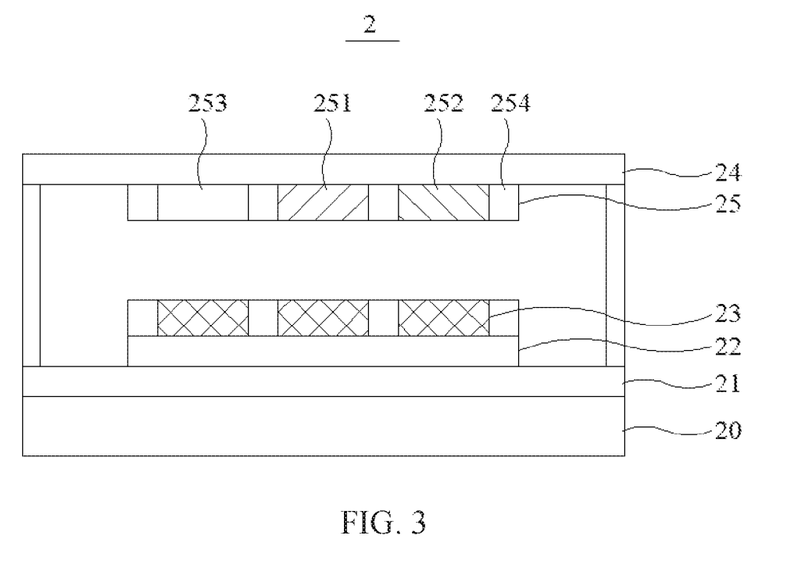
FIG. 3 is a schematic structural diagram of a display terminal provided by another embodiment of the present application.

Another embodiment of the present application also provides a display terminal 2, as shown in FIG. 3. FIG. 3 is a schematic structural diagram of a display terminal provided by another embodiment of the present application. The display terminal 2 includes a display panel and a terminal body 20. The display panel is arranged on the terminal body 20.

The display panel includes a substrate 21, a thin film transistor array layer 22 disposed on the substrate 21, and a plurality of blue organic light-emitting diode devices 23 arranged in an array on the thin film transistor array layer 22. The display panel 21 further includes a color filter substrate 24 disposed opposite to the substrate. a color conversion layer 25 is provided on a side of the color filter substrate 24 close to the substrate 21, and the color conversion layer 25 include a plurality of red conversion layers 251, a plurality of green conversion layers 252, and a plurality of light-transmitting areas 253 respectively corresponding to blue organic light-emitting diode devices 23, and a black matrix 254 is provided between adjacent ones of the red conversion layers 251, the green conversion layers 252, and the light-transmitting areas 253.

In an embodiment of the present application, the materials of the red conversion layer 251 and the green conversion layer 252 are the red quantum dot ink and the green quantum dot ink selected from the quantum dot inks provided in the foregoing embodiments, respectively. The blue light emitted by the blue organic light-emitting diode device 23 is excited by the quantum dots in the red conversion layer 251 to convert into red light, the blue light emitted by the blue organic light-emitting diode device 23 is excited by the quantum dots in the green conversion layer 252 to convert into green light, and the blue light emitted by the blue organic light-emitting diode device 23 passes through the light-transmitting area 253 and continues to maintain the original color unchanged. As such, full-color screen display of the display panel 21 is realized through the various color conversions described above.

In the embodiments of the present application, by replacing the materials of various color conversion layers in the prior art with the quantum dot ink provided in the above embodiments, the adhesion between the color conversion layer 25 and the color film substrate 24 can be improved, and the color conversion layer 25 may be provided with good self-repair performance, which can reduce the damage to the color conversion layer 25 caused by inevitable external damage such as scratching.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A quantum dot ink, composed of components comprising a quantum dot material, a functional aid, and a low-molecular-weight silicon polymer, wherein the low-molecular-weight silicon polymer has a general structural formula as follows:

wherein A1, A2 and A3 in the low-molecular-weight silicon polymer have a same structure with a general structural formula as follows:

wherein R1 is O or N, R2 is $-(CH_2)m-CH_3$, and R3 is O or NH;

wherein m is an integer from 0 to 12, n1 is an integer from 1 to 3, n2 is an integer from 1 to 3, n3 is an integer from 1 to 100, n4 is an integer from 1 to 5, and n5 is an integer from 1 to 6.

2. The quantum dot ink according to claim 1, wherein the low-molecular-weight silicon polymer has a molecular weight ranging between 500 and 8000 g/mol.

3. The quantum dot ink according to claim 1, wherein the low-molecular-weight silicon polymer is present in an amount of 10 wt % to 30 wt %.

4. The quantum dot ink according to claim 3, wherein the quantum dot material is present in an amount of 10 wt % to 50 wt %.

5. The quantum dot ink according to claim 4, wherein the functional aid is present in an amount of 0.1 wt % to 3 wt %.

6. The quantum dot ink according to claim 1, wherein the quantum dot material comprises a group II-IV compound, a group III-V compound, a group IV-VI compound, a group I-III-VI compound, or combinations thereof.

7. The quantum dot ink according to claim 1, wherein the functional aid comprises a surface tension regulator and a leveling agent.

8. A display terminal, comprising a display panel and a terminal body,
wherein the display panel is arranged on the terminal body, the display panel comprises a light-emitting layer or a color conversion layer, and a material of the light-emitting layer or the color conversion layer comprises a quantum dot ink composed of components comprising a quantum dot material, a functional aid, and a low-molecular-weight silicon polymer; and wherein the low-molecular-weight silicon polymer has a general structural formula as follows:

wherein A1, A2 and A3 in the low-molecular-weight silicon polymer have a same structure with a general structural formula as follows:

wherein R1 is O or N, R2 is —(CH$_2$)m-CH$_3$, and R3 is O or NH;

wherein m is an integer from 0 to 12, n1 is an integer from 1 to 3, n2 is an integer from 1 to 3, n3 is an integer from 1 to 100, n4 is an integer from 1 to 5, and n5 is an integer from 1 to 6.

9. The display terminal according to claim 8, wherein the low-molecular-weight silicon polymer has a molecular weight ranging between 500 and 8000 g/mol.

10. The display terminal according to claim 8, wherein the low-molecular-weight silicon polymer is present in an amount of 10 wt % to 30 wt % based on 100% of the components of the quantum dot ink.

11. The display terminal according to claim 10, wherein the quantum dot material is present in an amount of 10 wt % to 50 wt % based on 100% of the components of the quantum dot ink.

12. The display terminal according to claim 11, wherein the functional aid is present in an amount of 0.1 wt % to 3 wt % based on 100% of the components of the quantum dot ink.

13. The display terminal according to claim 8, wherein the quantum dot material comprises a group II-IV compound, a group III-V compound, a group IV-VI compound, a group I-III-VI compound, or combinations thereof.

14. The display terminal according to claim 8, wherein the functional aid comprises a surface tension regulator and a leveling agent.

15. A display terminal, comprising a display panel and a terminal body, wherein the display panel is arranged on the terminal body, the display panel comprises a light-emitting layer or a color conversion layer, and a material of the light-emitting layer or the color conversion layer comprises a quantum dot ink composed of components comprising a quantum dot material, a functional aid, and a low-molecular-weight silicon polymer; and wherein the low-molecular-weight silicon polymer has a general structural formula as follows:

wherein A1, A2, and A3 have a same structure with a general structural formula as follows:

wherein R1 is N, R2 is —(CH$_2$)m-CH$_3$, and R3 is NH;

wherein m is an integer from 0 to 12, n1 is an integer from 1 to 3, n2 is an integer from 1 to 3, n3 is an integer from 1 to 100, n4 is an integer from 1 to 5, and n5 is an integer from 1 to 6.

* * * * *